United States Patent [19]

Kurita et al.

[11] Patent Number: 4,945,398
[45] Date of Patent: Jul. 31, 1990

[54] OVERCURRENT PREVENTIVE DIODE

[75] Inventors: Yoshio Kurita, Kyoto; Katsuhiro Takami, Oumihachiman; Kenji Tanaka, Kyoto; Yuji Kosumi, Uji, all of Japan

[73] Assignee: Rohm Co., Ltd., Kyoto, Japan

[21] Appl. No.: 421,761

[22] Filed: Oct. 16, 1989

[30] Foreign Application Priority Data

Oct. 20, 1988 [JP] Japan .......................... 63-137016[U]

[51] Int. Cl.⁵ .................... H01L 27/02; H01L 23/48; H01L 23/28; H01L 23/02
[52] U.S. Cl. ...................................... 357/74; 357/51; 357/71; 357/72; 357/81
[58] Field of Search ...................... 357/51, 71, 72, 74, 357/81

[56] References Cited

U.S. PATENT DOCUMENTS

| | | | |
|---|---|---|---|
| 3,693,048 | 9/1972 | Doversberger et al. | 357/51 |
| 3,832,606 | 8/1974 | Furnival | 357/51 |
| 3,839,660 | 10/1984 | Stryker | 357/81 |
| 4,169,271 | 9/1979 | Saitoh | 357/51 |
| 4,547,830 | 10/1985 | Yamauchi . | |
| 4,554,574 | 11/1985 | Wright | 357/51 |
| 4,829,403 | 5/1989 | Harding | 357/81 |

Primary Examiner—J. Carroll
Attorney, Agent, or Firm—William H. Eilberg

[57] ABSTRACT

An overcurrent preventive diode comprises a diode chip sandwiched between respective bonding ends of first and second leads. The bonding end of the first lead is directly bonded to the diode chip into electrical conduction while being also kept in heat conduction with the chip. The bonding end of the second lead is held in heat conduction with the diode chip via a thin electrical insulating layer. The bonding end of the second lead and the insulating layer are shaped to expose an electrical connecting portion of the chip, thereby enabling the second lead bonding end to be electrically connected to the chip through a fusing wire which is designed to be melt-cut upon passage of a predetermined overcurrent.

10 Claims, 2 Drawing Sheets

OVERCURRENT PREVENTIVE DIODE

BACKGROUND OF THE INVENTION

1. Field of the Invention:

This invention relates generally to diodes, and more particularly to improvements in diodes such as rectifying diodes which are suitable for operation with a relatively large current.

2. Description of the Prior Art:

As is well known, some of semiconductor devices mounted on a printed circuit board generate heat even under a normal operating condition. Particularly, rectifying diodes, which are designed to operate with a relatively large current, are known to generate heat. An example of the prior art rectifying diodes is shown in FIG. 4 of the accompanying drawings for the convenience of explanation.

The prior art rectifying diode 20 illustrated in FIG. 4 comprises a diode chip 21 interposed between a pair of leads 22, 23. Both leads have their respective inner ends 22a, 23a bonded to the chip in electrical and heat conduction therewith. The chip together with the lead inner ends is enclosed in a molded resin package 24 which is made of a hard resin such as an epoxy resin. The outer ends 22b, 23b of the respective leads are led out through an opposite pair of side walls 24a, 24b of the resin package, and bent to come into contact with the bottom wall 24c of the package.

The illustrated prior art diode, which is of the surface mounting type, is mounted on a printed circuit board with the bent lead ends bonded to relevant portions of the circuit conductor pattern. Under a normal operating condition, the diode generates heat, but such heat is allowed to effectively dissipate without inside heat accumulation because both of the leads 22, 23 are held in good heat conduction with the diode chip 21.

However, if an overcurrent passes through the diode, the heat dissipation provided by the leads 22, 23 can no longer catch up with heat generation, resulting in overheating of the diode. Such an overheat may lead to a fire or otherwise thermally damage the printed circuit board as a whole or adjacent heat sensitive semiconductor devices.

One way to eliminate the problem of overheat is to separately provide a protective fuse which is melt-cut upon passage of an overcurrent. Such an IC protective fuse is disclosed for example in U.S. Pat. No. 4,547,830 to Yamauchi. However, the provision of the separate IC protective fuse results in added cost and more importantly in a mounting space loss of the area-limited circuit board.

Another possible way to eliminate the overheat problem, though not actually practiced, is to modify the diode to have an additional function of preventing overcurrent. For this purpose, instead of sandwiching the diode chip 21 between the two leads 22, 23, one of the leads is separated apart from the chip and electrically connected thereto through a thin wire which is melt-cut upon passage of an overcurrent.

However, the above hypothetical solution is disadvantageous in that one lead, because of thermal separation from the chip, cannot be utilized for dissipating the heat, so that the diode may overheat even under a normal operating condition. Further, departure from the sandwiching arrangement necessitates a drastic modification of the existing manufacturing apparatus designed exclusively for producing sandwiching-type diodes.

SUMMARY OF THE INVENTION

It is, therefore, an object of the present invention to provide a diode which has an additional function of preventing overcurrent to protect the circuit incorporating that diode, thereby making it unnecessary to use a separate circuit protective device.

Another object of the present invention is to provide an overcurrent preventive diode which retains the basic arrangement of the prior art diode to enable effective heat dissipation under normal operating condition.

A further object of the invention is to provide an overcurrent preventive diode which can be manufactured at a relatively low cost by utilizing the conventional process steps and equipments as much as possible.

Still another object of the invention is to provide an overcurrent preventive diode which reliably functions to open the relevant circuit at the time of an overcurrent.

According to the present invention, there is provided an overcurrent preventive diode comprising: a diode chip having a pair of bonding surfaces; a first lead having a bonding end bonded to one bonding surface of the diode chip into electrical and heat conduction therewith; a thin electrical insulating layer covering the other bonding surface of the diode chip but having an opening for exposing an electrical connecting portion of the other chip surface; a second lead having a bonding end provided with an opening in corresponding relation to the opening of the insulating layer, the bonding end of the second lead being held in heat conduction with the diode chip via the insulating layer; a fusing wire bonded both to the bonding end of the second lead and to the electrical connecting portion of the other chip surface, the wire being melt-cut upon passage of a predetermined overcurrent; and a molded resinous body enclosing the diode chip, both of the bonding lead ends, and the fusing wire.

Preferably, the fusing wire is made of a metal selected from a group consisting of gold, silver, copper, and aluminum. Alternatively, the fusing wire may also be made of sliver plated with gold.

According to an advantageous arrangement, the resinous body includes an inner portion made of a softer resin to completely enclose at least the fusing wire, and an outer portion made of a harder resin to completely enclose the inner portion. The inner portion of the resinous body may be made of a silicone resin, whereas the outer portion may be made of an epoxy resin.

Other objects, features and advantages of the present invention will be fully understood from the following detailed description given with reference to the accompanying drawings.

DETAILED DESCRIPTION OF THE PREFERRED EMBODIMENTS

Figure 1:
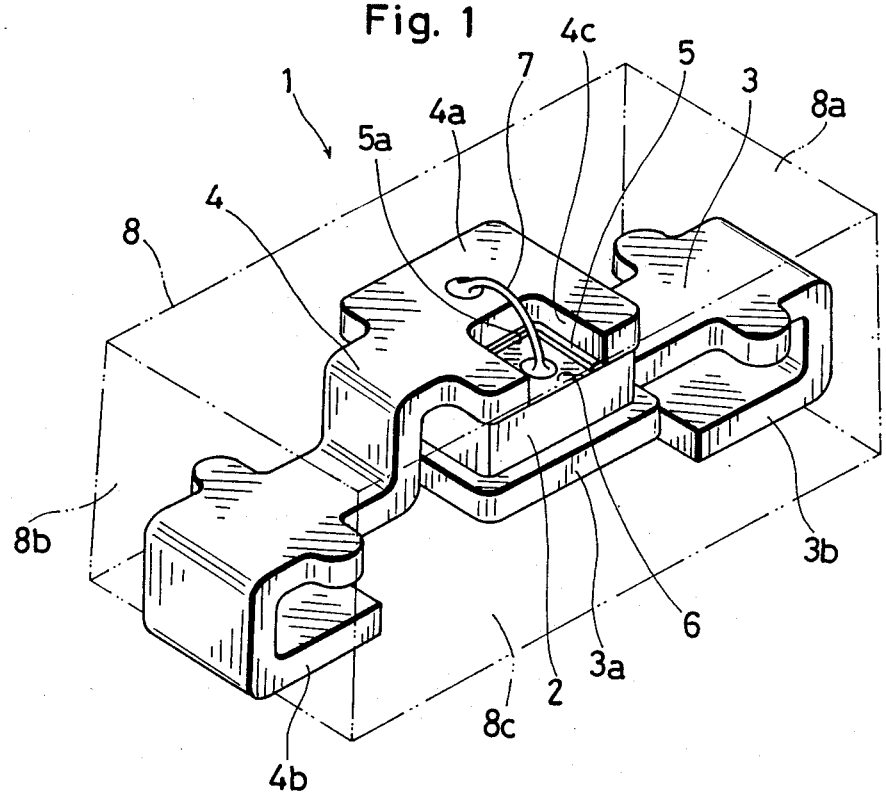
FIG. 1 is a perspective view showing an overcurrent preventive diode embodying the invention.
Figure 2:
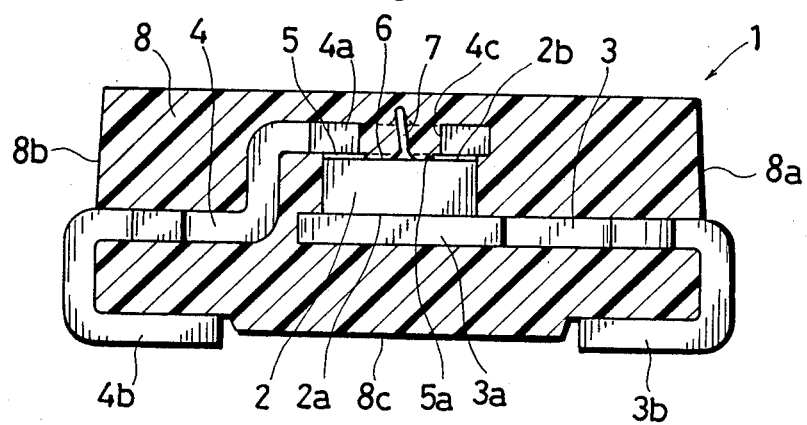
FIG. 2 is a front view showing the interior structure of the diode illustrated in FIG. 1.

Referring now to FIGS. 1 and 2 of the accompanying drawings, there is illustrated an overcurrent preventive diode 1 which is a rectifying diode of the surface mounting type according to the illustrated embodiment. The diode comprises a diode chip 2 having an opposite pair of bonding surfaces 2a, 2b. The chip is sandwiched between a first lead 3 and a second lead 4.

The first lead 3 has a bonding or inner end 3a and an outer end 3b. By a known die-bonding method, the inner end 3a is bonded to one (lower) bonding surface 2a of the chip into electrical and heat conduction therewith.

Similarly, the second lead 4 has a bonding or inner end 4a and an outer end 4b. The inner end 4a is held in heat conduction with the other (upper) bonding surface 2b of the chip via a thin electrical insulating layer 5.

The electrical insulating layer 5 may be an adhesive, particularly an epoxy adhesive, to have an additional function of fixing the second lead inner end 4a to the chip 2. Alternatively, the insulating layer may be made of glass which is a surface coating material for the chip. Regardless of materials, the insulating layer permits enough heat conduction between the second lead 4 and the chip 2 as long as the insulating layer is sufficiently thin. Generally, the thickness of the insulating layer may vary within a range of e.g. several micrometers (microns) to several tens of micrometers depending on the size of the chip or other parameters of the diode.

As better shown in FIG. 1, the insulating layer 5 has an opening or cutout 5a to expose an electrical connecting portion 6 on the upper surface 2b of the chip. In the illustrated embodiment, this opening is in the form of a rectangular cutout located at a marginal portion of the chip. Similarly, the bonding end 4a of the second lead 4 is also formed with a marginal rectangular opening or cutout 4c in corresponding relation to the opening 5a of the insulating layer. The respective openings 4c, 5a of the second lead bonding end and the insulating layer may be located centrally of the chip if the electrical connecting portion 6 is provided at such a location.

The electrical connecting portion 6 may be in the form of a flat conductor pad, as shown in FIGS. 1 and 2. Alternatively, the electrical connecting portion may be a conductor bump (not shown) which is commonly used in semiconductor devices.

According to the present invention, the bonding end 4a of the second lead 4 is electrically connected to the conductor pad 6 only through a thin wire 7 which is designed to be melt-cut upon passage of a predetermined overcurrent. The wire may be made of a metal preferably selected from the group consisting of gold, silver, copper and aluminum. The wire may also be made of silver plated with gold.

The diode chip 2 together with the bonding ends 3a, 4a of the respective leads 3, 4 and the fusable wire 7 is enclosed in a molded resinous body 8 which is made of a hard resin such as an epoxy resin. On the other hand, the outer ends 3b, 4b of the respective leads are led out through an opposite pair of side walls 8a, 8b of the resinous body, and bent onto the bottom wall 8c of the resin body, as illustrated in FIGS. 1 and 2. The thus assembled diode may be surface-mounted on a printed circuit board (not shown) by soldering the bent lead ends 3b, 4b to relevant portions of the PCB conductor pattern.

In operation, the diode 1 fulfils its current rectifying function under normal condition. Because the diode chip 2 is sandwiched between the inner ends 3a, 4a of the respective leads in heat conduction therewith, the diode is capable of effectively dissipating the heat generated under the normal condition, thereby preventing overheat which may lead to a fire or otherwise damage the circuit board as a whole and/or adjacent sensitive and costly semiconductor devices.

On the other hand, when a current exceeding a predetermined value passes through the fusing wire 7, it is instantly melt-cut to open the circuit. In this way, the diode is prevented from overheating under such an abnormal condition, consequently protecting the circuit board and/or adjacent sensitive and costly semiconductor devices. The broken diode may be replaced by another overcurrent preventive diode which is available at a relatively low cost.

Obviously, the use of the overcurrent preventive diode 1 according to the present invention makes it unnecessary to separately provide a circuit protective fuse such as disclosed in U.S. Pat. No. 4,547,830 described hereinbefore. Therefore, it is possible to save the mounting space for such an additional fuse, thereby contributing to miniaturization and simplification of the printed circuit board.

Because of sandwiching of the diode chip 2 between the two leads 3, 4, which is an arrangement similar to the prior art diode described hereinbefore, it is possible to utilize the existing manufacturing apparatus without making major modifications thereto. Therefore, the overcurrent preventive diode according to the present invention can be manufactured at a reasonable cost. In fact, the use of such a diode is more economical than separately providing a fuse.

The thin wire 7 as a fuse itself is known for example from U.S. Pat. No. 4,547,830. Therefore, various parameters such as length, diameter, and etc. of the fusing wire may be determined in accordance with the teaching of this patent, and for this reason are not set forth herein. The gist of the present invention resides in incorporation of such a fusing wire into the diode to have double functions while maintaining the basic arrangement (particularly the sandwiching construction) of the prior art diode.

Figure 3:
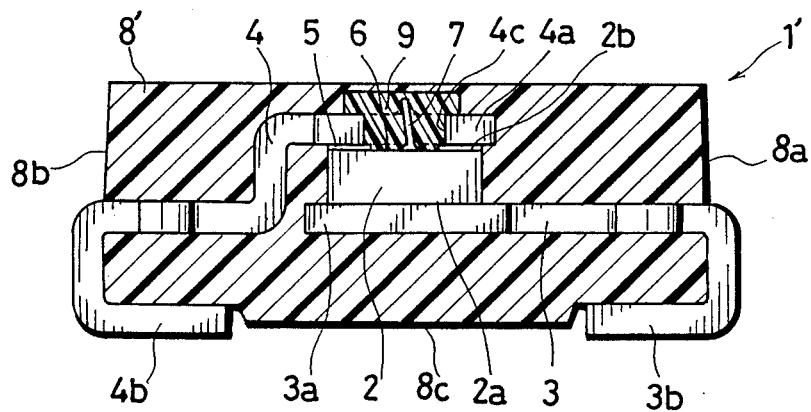
FIG. 3 is a front view showing the interior structure of another overcurrent preventive diode embodying the invention.
Figure 4:
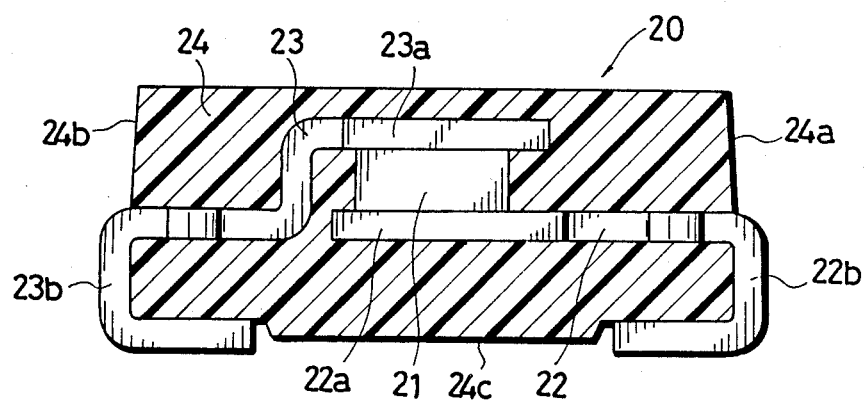
FIG. 4 is a front view in section showing a prior art diode.

FIG. 3 illustrates another overcurrent preventive diode 1' according to the present invention. The only difference from the arrangement of the preceding embodiment resides in the provision of a softer inner portion 9 embedded in a harder resinous package 8'. The inner resinous portion 9 is required to enclose at least the entirety of the fusing wire 7, as shown. Preferably, the inner portion 9 is made of a silicone resin, whereas the outer package 8' is made of an epoxy resin as in the previous embodiment.

According to the previous embodiment, the fusing wire 7 is entirely enclosed in the hard resinous body 8 in contact therewith. Thus, even if the wire 7 is melt-cut at the time of an overcurrent, the cut ends of the wire may be firmly retained by the surrounding resinous body and prevented from separating from each other, thereby failing to provide intended circuit opening.

According to the embodiment shown in FIG. 3, on the other hand, the softer inner portion 9 surrounding the fusing wire 7 is flexible enough to allow the melt-cut ends of the wire to readily separate from each other. In this way, the overcurrent preventive diode 1' reliably fulfils its additional function of opening the circuit upon passage of a predetermined overcurrent.

The present invention being thus described, it is obvious that the same may be varied in many ways. Such variations are not to be regarded as a departure from the spirit and scope of the invention, and all such modifications as would be obvious to those skilled in the art are intended to be included within the scope of the following claims.

We claim:

1. An overcurrent preventive diode comprising:
   a diode chip having a pair of bonding surfaces;
   a first lead having a bonding end bonded to one bonding surface of said diode chip into electrical and heat conduction therewith;
   a thin electrical insulating layer covering the other bonding surface of said diode chip but having an opening for exposing an electrical connecting portion of said other chip surface;
   a second lead having a bonding end provided with an opening in corresponding relation to said opening of said insulating layer, said bonding end of said second lead being held in heat conduction with said diode chip via said insulating layer;
   a fusing wire bonded both to said bonding end of said second lead and to said electrical connecting portion of said other chip surface, said wire being melt-cut upon passage of a predetermined overcurrent; and
   a molded resinous body enclosing said diode chip, both of said bonding lead ends, and said fusing wire.

2. The diode as defined in claim 1, wherein said openings of said insulating layer and said second lead are positioned at a marginal portion of said diode chip.

3. The diode as defined in claim 1, wherein said fusing wire is made of a metal selected from a group consisting of gold, silver, copper, and aluminum.

4. The diode as defined in claim 1, wherein said fusing wire is made of sliver plated with gold.

5. The diode as defined in claim 1, wherein said insulating layer is an adhesive layer for attaching said bonding end of said second lead to said other chip surface.

6. The diode as defined in claim 5, wherein said adhesive layer is made of an epoxy resin.

7. The diode as defined in claim 1, wherein said insulating layer is made of glass.

8. The diode as defined in claim 1, wherein said resinous body includes an inner portion made of a softer resin to completely enclose at least said fusing wire, and an outer portion made of a harder resin to completely enclose said inner portion.

9. The diode as defined in claim 8, wherein said inner portion of said resinous body is made of a silicone resin.

10. The diode as defined in claim 8, wherein said outer portion of said resinous body is made of an epoxy resin.

* * * * *